United States Patent [19]

Le Ngoc et al.

[11] Patent Number: 5,175,819

[45] Date of Patent: Dec. 29, 1992

[54] CASCADABLE PARALLEL TO SERIAL CONVERTER USING TAP SHIFT REGISTERS AND DATA SHIFT REGISTERS WHILE RECEIVING INPUT DATA FROM FIFO BUFFER

[75] Inventors: Danh Le Ngoc, Saratoga; Fulam Au, Milpitas; John R. Mick, Los Altos Hills, all of Calif.

[73] Assignee: Integrated Device Technology, Inc., Santa Clara, Calif.

[21] Appl. No.: 500,678

[22] Filed: Mar. 28, 1990

[51] Int. Cl.[5] .............................................. G06F 5/00
[52] U.S. Cl. ........................ 395/250; 364/238.7; 364/239.2; 364/939.5; 364/951; 364/926.2; 364/926.5; 364/DIG. 1; 341/101; 395/500
[58] Field of Search ............... 341/101; 395/250, 500

[56] References Cited
U.S. PATENT DOCUMENTS

| | | | |
|---|---|---|---|
| 4,218,758 | 8/1980 | Allen et al. | 364/900 |
| 4,298,936 | 11/1981 | Shapiro | 364/200 |
| 4,377,806 | 3/1983 | Elliot et al. | 341/101 |
| 4,497,041 | 1/1985 | Braun | 364/900 |
| 4,750,149 | 6/1988 | Miller | 364/900 |
| 4,907,186 | 3/1990 | Racey | 364/900 |
| 5,055,842 | 10/1991 | Mueller | 341/100 |
| 5,089,819 | 2/1992 | Yokosuka et al. | 341/101 |

Primary Examiner—Thomas C. Lee
Assistant Examiner—Ken S. Kim
Attorney, Agent, or Firm—Thomas E. Schatzel

[57] ABSTRACT

A parallel-to-serial FIFO buffer device (100) employs a FIFO buffer (110) for storing words of data; a tap-shift-register portion (112); and a data-shift-register portion (116) for converting from parallel to serial format words of data stored in the FIFO buffer (110), tap-shift-register portion (112) controls the conversion process, receives (150) a serial-input-expansion (RSIX) input signal, and develops (170) a serial-output-expansion (RSOX) output signal. The serial-input-expansion input signal (150) and the serial-output-expansion output signal (170) permit the device (100) to be connected with one, or more, similar, device(s) for word length and/or depth expansion.

5 Claims, 1 Drawing Sheet

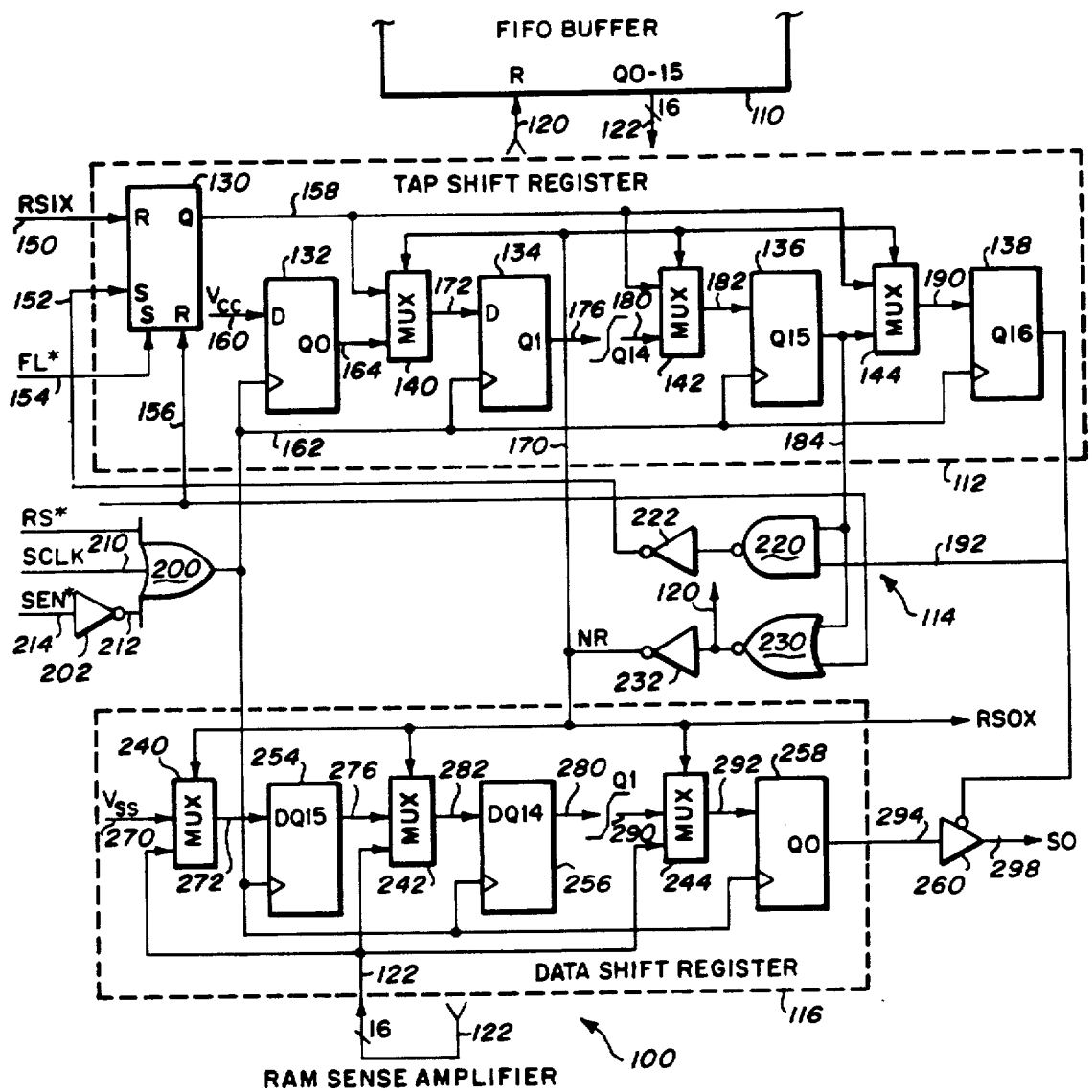
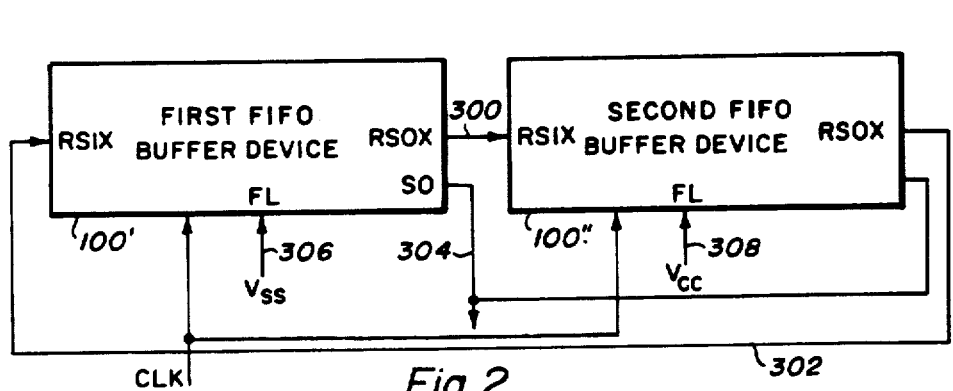

5,175,819

CASCADABLE PARALLEL TO SERIAL CONVERTER USING TAP SHIFT REGISTERS AND DATA SHIFT REGISTERS WHILE RECEIVING INPUT DATA FROM FIFO BUFFER

TECHNICAL FIELD

The present invention relates to integrated circuit type devices generally and more particularly to a FIFO buffer device having expandable parallel-to-serial conversion means.

BACKGROUND ART

A FIFO (first-in-first-out) buffer functions as a shift register having an additional control section that permits input data to "fall through" to the first vacant stage. In other words, if there is data stored in the FIFO buffer, it is available at the output even though all of the stages are not filled. Thus, in effect, a FIFO buffer functions as a "variable-length" shift register, the length of which is always the same as the data stored therein. Although shift registers may be used, of late, many FIFO buffers are implemented with a dual port, random access memory (RAM) array, a write counter, and a read counter. The write counter is configured to develop, at the write data address inputs of the RAM array, signals representing a write pointer address; and, the read counter is configured to develop, at the read data address inputs of the RAM array, signals representing a read pointer address.

Many applications, including laser printer applications, require that the format of data stored in the FIFO buffer be converted from parallel to serial format. Of course, circuitry is available which will perform the necessary parallel-to-serial format conversion. Unfortunately, the use of additional circuitry adds to the system cost and complexity.

In the U.S. Pat. No. 4,750,149 of Michael Miller a "Programmable FIFO Buffer" device is disclosed which includes a number of multiplexers and flip-flops configured to convert from parallel-to-serial format, data stored in a FIFO buffer. The multiplexers and flip-flops are so configured as to permit the word length (number of bits) to be externally programmed. In addition, the multiplexers and flip-flops are so configured as to permit the use of the device with a similar device for word expansion. Unfortunately, the above mentioned device requires that a relatively large number of device pins be employed.

DISCLOSURE OF THE INVENTION

It is therefore the primary object of the present invention to provide a FIFO buffer device having means for parallel-to-serial conversion.

Another object of the present invention is to provide a FIFO buffer device having means for word and depth expansion.

Yet another object of the present invention is to provide a FIFO buffer device having means for simplified interconnection.

Briefly, the presently preferred embodiment of a parallel-to-serial FIFO buffer device (100) in accordance with the present invention employs a FIFO buffer (110) for storing words of data; a tap-shift-register portion (112); and a data-shift-register portion (116) for converting from parallel to serial format words of data stored in the FIFO buffer (110). The tap-shift-register portion (112) controls the conversion process, receives (150) a serial-input-expansion (RSIX) input signal, and develops (170) a serial-output-expansion (RSOX) output signal. The serial-input-expansion input signal (150) and the serial-output-expansion output signal (170) permit the device (100) to be connected with one, or more, similar, device(s) for word length and/or depth expansion.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a schematic diagram of a parallel-to-serial FIFO buffer device in accordance with the present invention; and, FIG. 2 is a block diagram of a FIFO buffer system in accordance with the present invention employing two FIFO buffer devices each of which is of the type that is illustrated in FIG. 1.

BEST MODE FOR CARRYING OUT THE INVENTION

Illustrated in FIG. 1 of the drawing generally designated by the number 100 is the presently preferred embodiment of a parallel-to-serial FIFO buffer device in accordance with the present invention. Device 100 is shown to employ a FIFO buffer 110; a tap-shift-register portion, which is generally designated by the number 112; a logic portion, which is generally designated by the number 114 and which, with portion 112, forms a control portion; and a data-shift-register portion, which is generally designated by the number 116. In the presently preferred embodiment, FIFO buffer 110 is of the 1024 by sixteen type. Further, FIFO buffer 110 is of the type which develops on the various outputs of (a set of) sixteen read-data outputs, signals, the state of which represent the next (sixteen-bit) word of data stored in the buffer a predetermined period of time following the high-to-low transition of the logical state of a read signal developed on an (active-low) read-data-control input. FIFO buffer 110 is configured with the read-data-control input connected to a line 120 and with the sixteen read-data outputs each connected to a corresponding line of a sixteen line bus 122.

In the presently preferred embodiment, tap-shift-register portion 112 includes an RS (reset-set) type flip-flop, which is designated 130; seventeen D-type flip-flops (registers), represented by four flip-flops, which are respectively designated 132, 134, 136, and 138; and sixteen, two-line-to-one-line multiplexers, represented by three multiplexers, which are respectively designated 140, 142, and 144. In the presently preferred embodiment, flip-flop 130 is of the type which has two reset inputs and two set inputs. In another embodiment, a pair of gates are employed with a RS flip-flop, which has but a single reset input and a single reset input. Flip-flop 130 is configured with one of the flip-flop reset inputs connected to a serial-input-expansion line 150 to receive an externally developed serial-input-expansion (RSIX) input signal; with one of the flip-flop set inputs connected to a line 152; with the other one of the flip-flop set inputs connected to a first-load line 154 to receive an externally-developed (active-low) first-load (FL) signal; with the other one of the flip-flop reset inputs connected to a reset line 156 to receive an externally developed, (active-low) device 100 resetting (R) signal; and with the (active-high) flip-flop data output connected to a line 158, upon which the flip-flop develops a tap-shift-register-portion flip-flop pre-setting signal.

Flip-flop 132 is configured with the flip-flop data input connected to a line 160 to receive a high-logic-level potential; with the flip-flop clock input connected to a line 162 to receive an internally-developed, flip-flop-clocking signal; and with the flip-flop (active-high) data output connected to a line 164. Multiplexer 140 is configured with one of the multiplexer data inputs connected to line 158 to receive the tap-shift-register-portion flip-flop pre-setting signal; with the other one of the multiplexer data inputs connected to line 164; with the multiplexer (select) input connected to a serial-output-expansion line 170 to receive an internally-developed, combination next-read (NR) and serial-output-expansion (RSOX) output signal; and with the multiplexer data output connected to a line 172. Flip-flop 134 is configured with the flip-flop data input connected to line 172; with the flip-flop clock input connected to line 162 to receive the internally-developed clocking signal; and with the flip-flop (active-high) data output connected to a line 176.

The remaining multiplexers and flip-flops of tap-shift-register portion 112 are configured in a similar fashion (as multiplexer 140 and flip-flop 134). Specifically, Multiplexer 142 is configured with one of the multiplexer data inputs connected to line 158 to receive the tap-shift-register-portion flip-flop pre-setting signal; with the other one of the multiplexer data inputs connected by a line 180 to the data output (Q14) of the preceding flip-flop (not shown); with the multiplexer (select) control input connected to serial-output-expansion line 170 to receive the internally-developed combination next-read (NR) and serial-output-expansion (RSOX) output signal; and with the multiplexer data output connected to a line 182. Flip-flop 136 is configured with the flip-flop data input connected to line 182; with the flip-flop clock input connected to line 162 to receive the internally-developed clocking signal; and with the flip-flop (active-high) data output connected to a line 184. Multiplexer 144 is configured with one of the multiplexer data inputs connected to line 158 to receive the tap-shift-register-portion flip-flop pre-setting signal; with the other one of the multiplexer data inputs connected to line 184; with the multiplexer (select) control input connected to serial-output-expansion line 170 to receive the internally-developed combination next-read (NR) and serial-output-expansion (RSOX) output signal; and with the multiplexer data output connected to a line 190. Flip-flop 138 is configured with the flip-flop data input connected to line 190; with the flip-flop clock input connected to line 162 to receive the internally-developed clocking signal; and with the flip-flop (active-high) data output connected to a serial-data-output-control line 192, upon which the flip-flop develops an (active-low) serial-data-output-controlling signal.

Logic portion 114 includes circuitry for developing the line 162 signal; the line 152, output-controlling signal; the serial-output-expansion line 170, combination next-read (NR) and serial-output-expansion (RSOX) output signal; and the line 120, (active-low) read signal. For this purpose, in the presently preferred embodiment, logic portion 114 includes a number of gates and inverters. To develop the line 162, internally-developed clocking signal, a three-input OR gate 200 and an inverter 202 are included. Gate 200 is configured with one of the three gate inputs connected to reset line 156 to receive the externally-developed, (active-low) device 100 resetting (R) signal; with another one of the three gate inputs connected to a clock line 210 to receive an externally-developed, device 100 clocking (CLK) signal; with the other one of the three gate inputs coupled by a line 212 and inverter 202 to a line 214 to receive an externally-developed, (active-low) device 100 enabling (EN) signal; and with the gate output connected to line 162.

To develop the line 152 signal, in the presently preferred embodiment, a two-input AND gate 220 and an inverter 222 are included. Gate 220 is configured with one of the two gate inputs connected to line 184; with the other one of the two gate inputs connected to line 192; and with the gate output coupled by inverter 212 to line 152. In the presently Preferred embodiment, to develop the serial-output-expansion line 170 combination next-read (NR) and serial-output-expansion (RSOX) output signal, a two-input NOR gate 230 and an inverter 232 are included. Gate 230 is configured with one of the two gate inputs connected to line 184; with the other one of the two gate inputs connected to reset line 156 to receive the externally-developed, (active-low) device 100 resetting signal; and with the gate output connected to line 120, upon which the gate develops the read signal. Inverter 232 is configured with the inverter input connected to line 120 and the inverter output connected to serial-output-expansion line 170, upon which the inverter develops the combination next-read (NR) and serial-output-expansion (RSOX) output signal.

In the presently preferred embodiment, data-shift-register portion 116 includes sixteen, two-line-to-one-line multiplexers, represented by three multiplexers, which are respectively designated 240, 242, and 244; sixteen D-type flip-flops (registers), represented by three flip-flops, which are respectively designated 254, 256, and 258; and a tri-state buffer 260. Multiplexer 240 is configured with one of the multiplexer data inputs connected to a line 270 to receive a low-logic-level potential; with the other one of the multiplexer data inputs connected to the respective line of the sixteen lines of bus 122 to receive the signal representing the highest-order bit (bit fifteen) of the next word of data stored in FIFO buffer 110; with the multiplexer (select) control input connected to serial-output-expansion line 170 to receive the internally-developed combination next-read (NR) and serial-output-expansion (RSOX) output signal; and with the multiplexer data output connected to a line 272. Flip-flop 254 is configured with the flip-flop data input connected to line 272; with the flip-flop clock input connected to line 162 to receive the internally-developed clocking signal; and with the flip-flop (active-high) data output connected to a line 276.

Multiplexer 242 is configured with one of the multiplexer data inputs connected to line 276; with the other one of the multiplexer data inputs connected to the respective line of the sixteen lines of bus 122 to receive the signal representing the next-to-highest order bit (bit fourteen) of the next word of data stored in FIFO buffer 110; with the multiplexer (select) control input connected to serial-output-expansion line 170 to receive an internally-developed combination next-read (NR) and serial-output-expansion (RSOX) output signal; and with the multiplexer data output connected to a line 282.

Flip-flop 256 is configured with the flip-flop data input connected to line 282; with the flip-flop clock input connected to line 162 to receive the internally-developed clocking signal; and with the flip-flop (active-high) data output connected to a line 286.

The remaining multiplexers and flip-flops of data shift register portion 116 are configured in a similar fashion (as flip-flops 254 and 256 and multiplexer 242). Specifically, Multiplexer 244 is configured with one of the multiplexer data inputs connected by a line 290 to the data output (Q1) of the preceding flip-flop (not shown); with the other one of the multiplexer data inputs connected to the respective line of the sixteen lines of bus 122 to receive the signal representing the lowest-order bit (bit zero) of the next word of data stored in FIFO buffer 110; with the multiplexer (select) control input connected to serial-output-expansion line 170 to receive the internally-developed combination next-read (NR) and serial-output-expansion (RSOX) output signal; and with the multiplexer data output connected to a line 292. Flip-flop 258 is configured with the flip-flop data input connected to line 292; with the flip-flop clock input connected to line 162 to receive the internally-developed clocking signal; and with the flip-flop (active-high) data output connected to a line 294.

Tri-state buffer 260 is configured with the buffer data input connected to line; with the buffer output enable (control) input connected to serial-output-expansion line 170 to receive the (active-low) serial-data-output-controlling signal; and with the buffer data output connected to a serial-data-output line 298, upon which the buffer develops a serial-data-output (SO) signal.

For word length and/or depth expansion, two, or more, parallel-to-serial FIFO buffer devices, in accordance with the present invention, are connected as is shown in FIG. 2. More specifically, shown in FIG. 2 are two blocks, including a block, which is designated 110' and which represents a first one of the FIFO buffer devices, and a block, which is designated 110'' and which represents the other (second) one of the FIFO buffer devices. The serial-output-expansion (RSOX) output (represented by serial-output-expansion line 170 in FIG. 1) of each one of the FIFO buffer devices is connected to the serial-input-expansion (RSIX) input (represented by serial-input-expansion line 150 in FIG. 1) of the next one of the devices, as represented by a line 300 in FIG. 2. The serial-output-expansion (RSOX) output of the last one of the FIFO buffer devices is connected to the serial-input-expansion (RSIX) input of the first one of the devices, as represented by a line 302 in FIG. 2. Connected to a common serial output line, as represented by a line 304 in FIG. 2, is the serial output (SO) (represented by serial-data-output line 298 in FIG. 1) of each of the FIFO buffer devices. The first-load (FL) input (represented by first-load line 154 in FIG. 1) of the first one of the devices is connected to receive a low-logic-level potential, as represented by a line 306. The first-load (FL) input of each of the other devices is connected to receive a high-logic-level potential, as represented by a line 308. Connected to a respective one of three common lines (not shown) is the reset (RS), the clock (CLK), and the enable (EN) inputs (represented by lines 156, 210, and 214 in FIG. 1) of each of the FIFO buffer devices.

Operationally, when the FIFO buffer devices are enabled, each of the devices, in turn, develops on line 304 (shown in FIG. 2), a signal, the state of which represents the various bits of the respective portion of each of the stored data words. During sixteen cycles of the clocking (CLK) signal, externally developed on device 100' clock line 210 (shown in FIG. 1), device 100' (shown in FIG. 2) develops on line 304 (shown in FIG. 2, device 100' serial-data-output line 298 shown in FIG. 1) the signal representing the various bits of the respective portion of one of the stored data words. Also, during this period, device 100' develops on device 100' line 192 (shown in FIG. 1) a signal having a low-logic-potential level (enabling device 100' tri-state buffer 260, also shown in FIG. 1) and device 100'' develops on device 100'' line 192 (shown in FIG. 1) a signal having a high-logic-potential level (disabling device 100'' tri-state buffer 260, also shown in FIG. 1). Further, during this period, device 100' develops on line 300 (shown in FIG. 2, device 100' serial-output-expansion line 170, shown in FIG. 1) and device 100'' develops on line 302 (shown in FIG. 2, device 100'' serial-output-expansion line 170, shown in FIG. 1) signals having a low-logic-potential level. In addition, during this period, as the various bits of the respective portion of the respective data word are shifted through the device 100' data-shift-register-portion 116 flip-flops (device 100' flip-flops 254, 256, and 258, shown in FIG. 1) and multiplexers (device 100' multiplexers 242 and 244, also shown in FIG. 1), the high-logic-level state, established by the device 100' line 160 (shown in FIG. 1) potential, is shifted through the device 100' tap-shift-register-portion 112 flip-flops (device 100' flip-flops 132, 134, 136, and 138, shown in FIG. 1) and multiplexers (device 100' multiplexers 140, 142, and 144, also shown in FIG. 1).

Thereafter, device 100' develops the line 300 (shown in FIG. 2, device 100' serial-output-expansion line 170, shown in FIG. 1) signal so as to have a high-logic-potential level from the low-level-to-high-level transition of one cycle of the clocking (CLK) signal, externally developed on clock line 210 (shown in FIG. 1) until the low-level-to-high-level transition of the next one of the cycles of the clocking (CLK) signal. Responsive thereto, device 100'' (shown in FIG. 2) loads a low-logic-level state into the device 100'' tap-shift-register-portion 112 flip-flops (device 100'' flip-flops 132, 134, 136, and 138, shown in FIG. 1) and loads the logic states representing the various bits of the respective portion of the instant data word into the device 100'' data-shift-register-portion 116 flip-flops (device 100'' flip-flops 254, 256, and 258, shown in FIG. 1). Then, during the next sixteen cycles of the clocking (CLK) signal, externally developed on device 100'' clock line 210 (shown in FIG. 1), device 100'' (shown in FIG. 2) develops on line 304 (shown in FIG. 2, device 100'' serial-data-output line 298 shown in FIG. 1) the signal representing the various bits of the respective portion of the data words. Next, device 100'' develops the line 302 (shown in FIG. 2, device 100'' serial-output-expansion line 170, shown in FIG. 1) signal so as to have a high-logic-potential level from the low-level-to-high-level transition of one cycle of the clocking (CLK) signal, externally developed on clock line 210 (shown in FIG. 1) until the low-level-to-high-level transition of the next one of the cycles of the clocking (CLK) signal to pass control back to device 100' (shown in FIG. 2).

In the presently preferred embodiment, the various components of FIFO buffer device 100 all integrated into a single device using CMOS technology.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. A parallel-to-serial FIFO-buffer device comprising in combination:
- a FIFO buffer (110) having a read-data-control input and a set of read-data outputs;
- a first line (158);
- a second line (162);
- a serial-input-expansion line (150);
- a serial-output-expansion line (170);
- a serial-data-output-control line (192);
- a serial-data-output line (298);
- clocking-signal-developing means (200 and 202) connected to said second line (162);
- tap-shift-register means (112) including,
    - pre-set-signal-developing means (130, 220, and 222) connected to said serial-input-expansion line (150) and to said first line (158),
    - first-register means (132) having a data input connected (160) to receive a predetermined-logic-level potential, a clock input connected to said second line (162), and a data output,
    - first-multiplexer means (140) having a first-data input connected to said first line (158), a second-data input connected (164) to said tap-shift-register-means-first-register-means-data output, a select input connected to said serial-output-expansion line (170), and a data output,
    - second-register means (134) having a data input connected to said tap-shift-register-means-first-multiplexer-means-data output, a clock input connected to said second line (162), and a data output,
    - second-multiplexer means (142) having a first-data input connected to said first line (158), a second-data input, a select input connected to said serial-output-expansion line (170), and a data output,
    - third-register means (136) having a data input connected to said tap-shift-register-means-second-multiplexer-means-data output, a clock input connected to said second line (162), and a data output, and
    - serial-data-output-controlling-signal-developing means (144 and 138) connected to said first line (158), to said tap-shift-register-means-third-register-means-data output, to said serial-output-expansion line (170), and to said serial-data-output-control line (192);
- next-read-signal-developing means (230 and 232) connected to said tap-shift-register-means-third-register-means-data output and to said serial-output-expansion line (170);
- data-shift-register means (116) including,
    - first-multiplexer means (240) having a first-data input connected (270) to receive a predetermined-logic-level potential, a second-data input connected (122) to said FIFO-buffer-read-data-output set, a select input connected to said serial-output-expansion line (170), and a data output,
    - first-register means (254) having a data input connected to said data-shift-register-means-first-multiplexer-means-data output, a clock input connected to said second line (162), and a data output,
    - second-multiplexer means (242) having a first-data input connected to said data-shift-register-means-first-register-means data output, a second-data input connected (122) to said FIFO-buffer-read-data-output set, a select input connected to said serial-output-expansion line (170), and a data output.
    - second-register means (256) having a data input connected to said data-shift-register-means-second-multiplexer-means-data output, a clock input connected to said second line (162), and a data output,
    - third-multiplexer means (240) having a first-data input, a second-data input connected (122) to said FIFO-buffer-read-data-output set, a select input connected to said serial-output-expansion line (170), and a data output,
    - third-register means (258) having a data input connected to said data-shift-register-means-third-multiplexer-means-data output, a clock input connected to said second line (162), and a data output; and
- tri-state-buffer means (260) having a data input connected to said data-shift-register-means-third-register-means data output, a control input connected to said serial-data-output-control line (192), and an output connected to said serial-data-output line (298).

2. A parallel-to-serial FIFO-buffer device as recited in claim 1 wherein said serial-data-output-controlling-signal-developing means (144 and 138) includes,
- third-multiplexer means (144) having a first-data input connected to said first line (158), a second-data input connected (184) to said tap-shift-register-means-third-register-means-data output, a select input connected to said serial-output-expansion line (170), and a data output,
- fourth-register means (138) having a data input connected to said tap-shift-register-means-third-multiplexer-means-data output, a clock input connected to said second line (162), and a data output to said serial-data-output-control line (192).

3. A FIFO buffer system comprising in combination: at least a first and a second parallel-to-serial FIFO-buffer device, each of which includes,
- a FIFO buffer (110) having a read-data-control input and a set of read-data outputs;
- a first line (158);
- a second line (162);
- a serial-input-expansion line (150);
- a serial-output-expansion line (170);
- a serial-data-output-control line (192);
- a serial-data-output line (298);
- clocking-signal-developing means (200 and 202) connected to said second line (162);
- tap-shift-register means (112) including,
    - pre-set-signal-developing means (130, 220, and 222) connected to said serial-input-expansion line (150) and to said first line (158),
    - first register means (132) having a data input connected (160) to receive a predetermined-logic-level potential, a clock input connected to said second line (162), and a data output,
    - first-multiplexer means (140) having a first-data input connected to said first line (158), a second-data input connected (164) to said tap-shift-register-means-first-register-means-data output, a select input connected to said serial-output-expansion line (170), and a data output, second-register means (134) having a data input connected to said tap-shift-register-means-first-multiplexer-means-data output, a clock input connected to said second line (162), and a data output, second-multiplexer means (142) having a first-data input connected to said first line (158), a second-data input, a select input connected to said serial-output-expansion line (170), and a data output, third-register means (136) having a data input connected to said tap-shift-register-means-second-multiplexer-means-data output, a clock input connected to said second line (162), and a data output, and serial-data-output-controlling-signal-developing means (144 and 138) connected to said first line (158), to said tap-shift-register-means-third-register-means-data output, to said serial-output-expansion line (170), and to said serial-data-output-control line (192);

next-read-signal-developing means (230 and 232) connected to said tap-shift-register-means-third-register-means-data output and to said serial-output-expansion line (170);

data-shift-register means (116) including, first-multiplexer means (240) having a first-data input connected (270) to receive a predetermined-logic-level potential, a second-data input connected (122) to said FIFO-buffer-read-data-output set, a select input connected to said serial-output-expansion line (170), and a data output, first-register means (254) having a data input connected to said data-shift-register-means-first-multiplexer-means-data output, a clock input connected to said second line (162), and a data output, second multiplexer means (242) having a first-data input connected to said data-shift-register-means-first-register-means data output, a second-data input connected (122) to said FIFO-buffer-read-data-output set, a select input connected to said serial-output-expansion line (170), and a data output, second-register means (256) having a data input connected to said data-shift-register-means-second-multiplexer-means-data output, a clock input connected to said second line (162), and a data output, third-multiplexer means (240) having a first-data input, a second-data input connected (122) to said FIFO-buffer-read-data-output set, a select input connected to said serial-output-expansion line (170), and a data output, third-register means (258) having a data input connected to said data-shift-register-means-third-multiplexer-means-data output, a clock input connected to said second line (162), and a data output; and tri-state-buffer means (260) having a data input connected to said data-shift-register-means-third-register-means data output, a control input connected to said serial-data-output-control line (192), and an output connected to said serial-data-output line (298); and wherein said first-parallel-to-serial-FIFO-buffer-device-serial-output-expansion line (170) is connected to said second-parallel-to-serial-FIFO-buffer-device-serial-input-expansion line (150).

4. A parallel-to-serial FIFO-buffer device as recited in claim 3 wherein said first-parallel-to-serial-FIFO-buffer-device-serial-data-output-controlling-signal-developing means (144 and 138) includes, third-multiplexer means (144) having a first-data input connected to said first-parallel-to-serial-FIFO-buffer-device-first line (158), a second-data input connected (184) to said first-parallel-to-serial-FIFO-buffer-device-tap-shift-register-means-third-register-means-data output, a select input connected to said first-parallel-to-serial-FIFO-buffer-device-serial-output-expansion line (170), and a data output, fourth-register means (138) having a data input connected to said first-parallel-to-serial-FIFO-buffer-device-tap-shift-register-means-third-multiplexer-means-data output, a clock input connected to said first-parallel-to-serial-FIFO-buffer-device-second line (162), and a data output to said first-parallel-to-serial-FIFO-buffer-device-serial-data-output-control line (192).

5. A parallel-to-serial FIFO-buffer device as recited in claim 4 wherein said second-parallel-to-serial-FIFO-buffer-device-serial-data-output-controlling-signal-developing means (144 and 138) includes, third-multiplexer means (144) having a first-data input connected to said second-parallel-to-serial-FIFO-buffer-device-first line (158), a second-data input connected (184) to said second-parallel-to-serial-FIFO-buffer-device-tap-shift-register-means-third-register-means-data output, a select input connected to said second-parallel-to-serial-FIFO-buffer-device-serial-output-expansion line (170), and a data output, fourth-register means (138) having a data input connected to said second-parallel-to-serial-FIFO-buffer-device-tap-shift-register-means-third-multiplexer-means-data output, a clock input connected to said second-parallel-to-serial-FIFO-buffer-device-second line (162), and a data output to said second-parallel-to-serial-FIFO-buffer-device-serial-data-output-control line (192).

* * * * *